US007307440B2

(12) United States Patent
Miller et al.

(10) Patent No.: US 7,307,440 B2
(45) Date of Patent: Dec. 11, 2007

(54) SEMICONDUCTOR INTEGRATED CIRCUIT TESTER WITH INTERCHANGEABLE TESTER MODULE

(75) Inventors: Wayne H. Miller, Los Altos, CA (US); Carlos R. Ramos, San Jose, CA (US); Peter S. Young, San Francisco, CA (US)

(73) Assignee: Credence Systems Corporation, Milpitas, CA (US)

( * ) Notice: Subject to any disclaimer, the term of this patent is extended or adjusted under 35 U.S.C. 154(b) by 45 days.

(21) Appl. No.: 11/258,529

(22) Filed: Oct. 25, 2005

(65) Prior Publication Data

US 2007/0090850 A1    Apr. 26, 2007

(51) Int. Cl.
 *G01R 31/02* (2006.01)
(52) U.S. Cl. .................. 324/763; 324/760; 324/765
(58) Field of Classification Search ............... None
See application file for complete search history.

(56) References Cited

U.S. PATENT DOCUMENTS

| 5,216,361 | A  | * | 6/1993  | Akar et al.     | 324/761  |
| 6,331,770 | B1 | * | 12/2001 | Sugamori        | 324/158.1|
| 6,441,630 | B1 | * | 8/2002  | Obikane et al.  | 324/758  |
| 6,625,557 | B1 | * | 9/2003  | Perkins et al.  | 702/117  |
| 7,030,642 | B2 | * | 4/2006  | Butsch et al.   | 324/767  |

* cited by examiner

*Primary Examiner*—Minh N. Tang
(74) *Attorney, Agent, or Firm*—John Smith-Hill; Smith-Hill and Bedell (57) ABSTRACT

A test head for an integrated circuit tester includes a main chassis defining a chamber that is open at the top. Tester modules are installed in the chamber, each tester module being removable as a unit from the chamber and including a tester module chassis, multiple pin electronics cards, and a tester module interface structure exposed at the top of the chamber. A test head interface structure is engageable with the tester module interface structures of the tester modules for connecting the tester module interface structures to a device interface unit.

17 Claims, 6 Drawing Sheets

SEMICONDUCTOR INTEGRATED CIRCUIT TESTER WITH INTERCHANGEABLE TESTER MODULE

BACKGROUND OF THE INVENTION

This invention relates to a semiconductor integrated circuit tester with an interchangeable tester module.

A semiconductor integrated circuit (IC) tester for testing on a production scale may include a host computer, a test head and a manipulator for positioning the test head at a desired location and orientation for docking to a wafer prober or a device handler. The test head comprises a chassis that accommodates multiple pin electronics cards. Each pin electronics card implements multiple tester channels, each having an I/O terminal. The I/O terminals of the tester channels are connected through a test head interface structure to contact pads on one side (the tester side) of a DUT board. Corresponding pads on the opposite side (the DUT side) of the DUT board are connected to respective pins of sockets for receiving packaged units of a device (in the case of the tester being used with a device handler) or to pins of a probe card (in the case of the tester being used with a wafer prober).

The structure of a pin electronics card depends on the nature of the test being performed at the I/O terminals of the channels that are implemented on the particular card. Typically, a given pin electronics card may be a digital card for digital testing or a mixed signal card for testing with both digital and analog signals. In the event that a tester that has been used for testing units of a given product is to be used for testing units of a different product, it may be necessary to remove several cards from the test head chassis and replace them with other cards. Generally, the resources that have been removed from the test head chassis will remain idle until they are once more installed in the test head chassis.

Another type of IC tester is known as a personal tester. A personal tester may be used by an engineer for testing a single unit of a product, rather than in a production environment. The personal tester is somewhat similar in its basic architecture to the production tester, in that the personal tester comprises a chassis that accommodates multiple pin electronics cards. However, the DUT board of the personal tester may interface directly to the pin electronics cards rather than through a separate interface structure. Typically, a personal tester has more limited capabilities than a production tester. For example, the personal tester may be configured for digital testing or for mixed signal testing but in the event that it is configured for mixed signal testing its capabilities for digital testing are rather limited.

The test head of the conventional production tester is typically supported by the manipulator by means of two stub shafts that project from the chassis through respective side walls of the test head and are received in bearings that are attached to respective arms of the manipulator. The test head can then be turned relative to the manipulator arms by pivoting about the common axis of the stub shafts. A clamp secures the test head in a desired orientation about the pivot axis relative to the arms of the manipulator. A technician can release the clamp, turn the test head about the pivot axis to a desired orientation, and then engage the clamp once again. Let us assume for the purpose of the following discussion that the axis of pivotal movement is horizontal since pivotal movement about a horizontal axis will be sufficient to illustrate the invention. However, it will be appreciated that, in general, the pivot axis need not be horizontal and that the manipulator allows movement of the test head in other degrees of freedom.

In the conventional tester, the shafts are positioned generally centrally in the opposite side walls of the tester, and in the conventional tester the center of gravity of the test head is not necessarily close to the axis of pivotal movement. The torque required to hold the test head at a particular orientation about the pivot axis will vary depending on the orientation of the test head and will be a maximum when the center of gravity of the test head is at the same height as the axis of pivotal movement of the test head. The clamp must be designed to restrain movement of the test head against the maximum torque that may be exerted by the test head, and since the test head itself is heavy, the maximum torque may be substantial. Further, when the clamp is released, the torque exerted by the test head may cause the test head to turn suddenly about the pivot axis and this may pose a danger of injury to the technician.

The host computer is connected to the test head through cables that enter the test head through one or both of the side walls. In addition, power cables pass through one or both side walls of the test head. It is important when turning the test head about the pivot axis to avoid interference between the cables and the arms of the manipulator, since this could lead to damage to the tester.

SUMMARY OF THE INVENTION

According to a first aspect of the present invention there is provided a test head for an integrated circuit tester, the test head comprising a main chassis defining a chamber having a top and a bottom, the chamber being open at the top, at least first and second tester modules installed in the chamber, each tester module being removable as a unit from the chamber and comprising a tester module chassis, a plurality of pin electronics cards, and a tester module interface structure exposed at the top of the chamber, and a test head interface structure engageable with the tester module interface structures of the tester modules for connecting the tester module interface structures to a device interface unit.

According to a second aspect of the present invention there is provided a test head for an integrated circuit tester, the test head comprising a main chassis, a pin electronics interface structure mounted in the main chassis and defining an engagement axis, a test head interface structure engageable with the pin electronics interface structure and disengageable from the pin electronics interface structure by movement relative to the pin electronics interface structure substantially along the engagement axis, an engagement mechanism for forcing the test head interface structure into engagement with the pin electronics interface structure, the engagement mechanism comprising a cam follower that projects from the test head interface structure, a cam member that is attached to the main chassis and is movable relative to the main chassis, the cam member being formed with a first cam slot including an entrance region for receiving the cam follower that projects from the test head interface structure, and a drive mechanism effective to drive the cam member to move relative to the main chassis, and a device interface unit engageable with the test head interface structure and disengageable from the test head interface structure by movement relative to the test head interface structure substantially along said engagement axis, and wherein the engagement mechanism further comprises a cam follower that projects from the device interface unit, and the cam member is formed with a second cam slot including an entrance region for receiving the cam follower that projects from the device interface unit, whereby movement of the cam member in a first direction both forces the test head interface structure into engagement with the pin electronics interface structure and forces the device interface unit into engagement with the test head interface structure.

According to a third aspect of the present invention there is provided test equipment comprising a personal tester including a chassis and a first tester module that is removably installable in the personal tester chassis, wherein the first tester module includes a tester module interface structure for engaging a personal tester device interface board, a production tester including a manipulator and a test head attached to the manipulator, wherein the test head includes a chassis for removably accommodating at least a second tester module and a test head interface structure that is engageable with a tester module interface structure of the second tester module and is also engageable with a production tester device interface board, for coupling the tester module interface of the second tester module to the production tester device interface board, and wherein the first and second tester modules are interchangeable between the personal tester and the test head of the production tester, whereby each of the first and second tester modules is installable selectively either in the test head chassis of the production tester or in the chassis of the personal tester.

According to a fourth aspect of the present invention there is provided a semiconductor integrated circuit tester comprising a manipulator having a U-shaped frame including a base and first and second arms, first and second bearings mounted in the first and second arms respectively, and a mechanism for orienting the frame so that the base and the first and second arms are substantially horizontal, a test head mounted between the first and second arms, the test head including a chassis and first and second shafts projecting from opposite respective sides of the chassis and journalled in the first and second bearings respectively, and wherein the first shaft is tubular and a utility line or a data line is threaded through the first shaft.

According to a fifth aspect of the present invention there is provided a semiconductor integrated circuit tester comprising a manipulator having a U-shaped frame including a base and first and second arms, first and second substantially coaxial bearings mounted in the first and second arms respectively, and a mechanism for orienting the frame so that the base and the first and second arms are substantially horizontal, a test head mounted between the first and second arms, the test head including a chassis and first and second substantially coaxial shafts projecting from opposite respective sides of the chassis and journalled in the first and second bearings respectively, and wherein the center of gravity of the test head is close to the common axis of the first and second shafts.

According to a sixth aspect of the present invention there is provided a test head for a semiconductor integrated circuit tester, the test head comprising a main chassis having first and second opposite main faces, a test head interface structure engageable with the main chassis at the first main face, a door structure attached to the main chassis and pivotable relative to the main chassis between a first position, in which the door structure engages the main chassis at the second main face, and a second position, in which the door structure permits access to the main chassis by way of the second main face.

BRIEF DESCRIPTION OF THE DRAWINGS

For a better understanding of the invention, and to show how the same may be carried into effect, reference will now be made, by way of example, to the accompanying drawings, in which.

Two or more related elements illustrated in the drawings may be designated by the same reference numeral and different respective letter suffixes. In referring to one of these related elements, the reference numeral may be used alone, without a suffix, if it is not necessary in the context to distinguish between the related elements.

DETAILED DESCRIPTION

Figure 1:
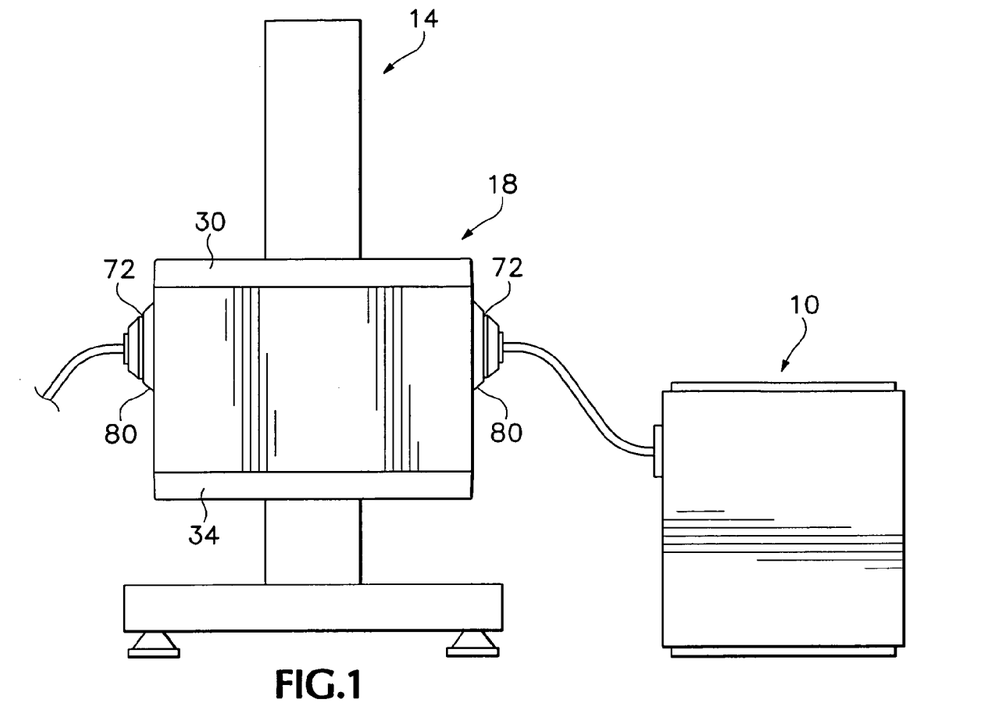
FIG. 1 is a simplified front elevation of a production tester embodying the present invention.

Referring to FIG. 1, the illustrated tester comprises a host computer 10 (shown only schematically), a manipulator 14 and a test head 18. For convenience and brevity, the test head will be described in the orientation that is illustrated in FIG. 1, but it will be understood that the test head may be used in other orientations.

Figure 2:
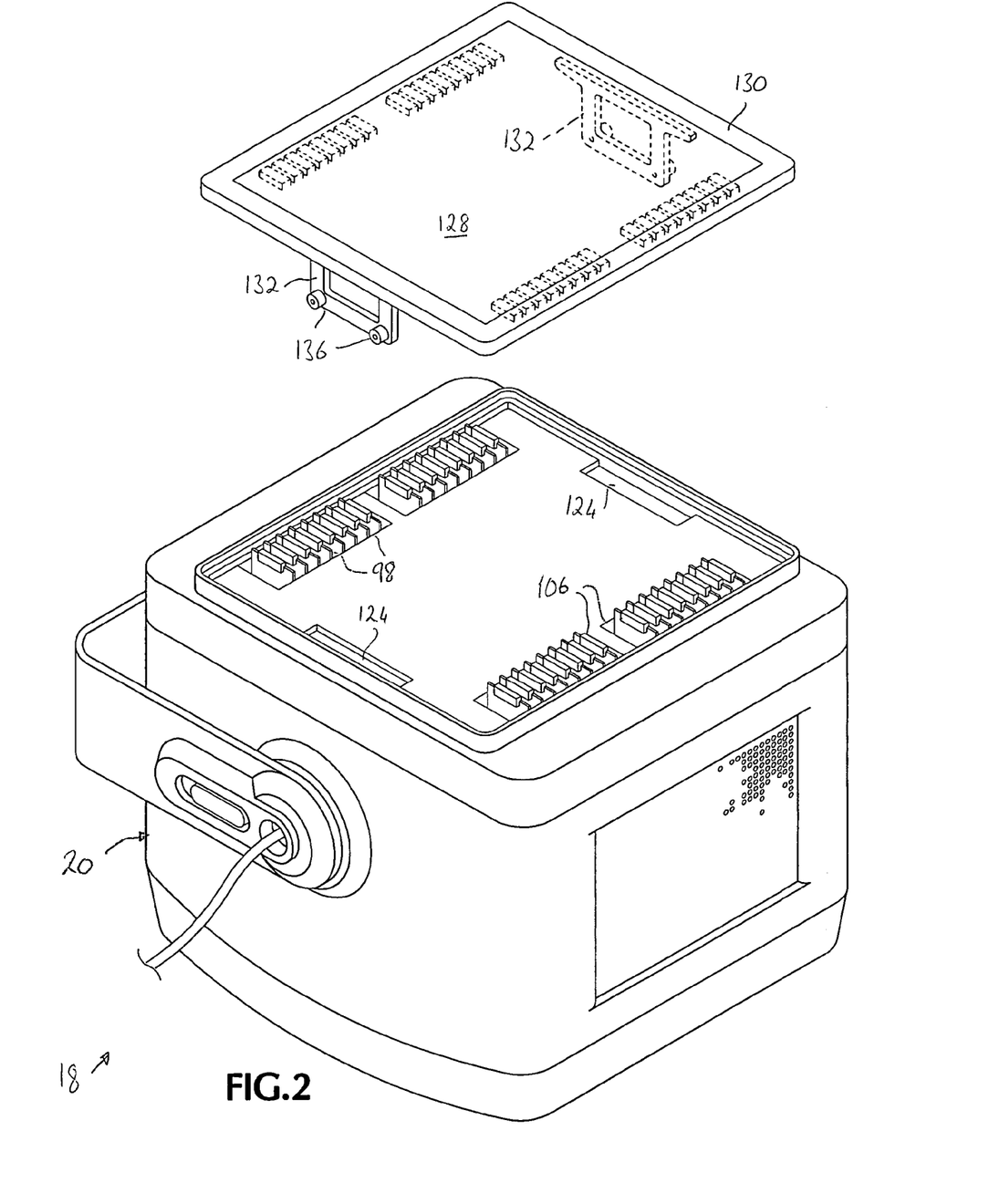
FIG. 2 is an enlarged perspective view of the test head of the tester shown in FIG. 1 in a closed configuration.
Figure 3:
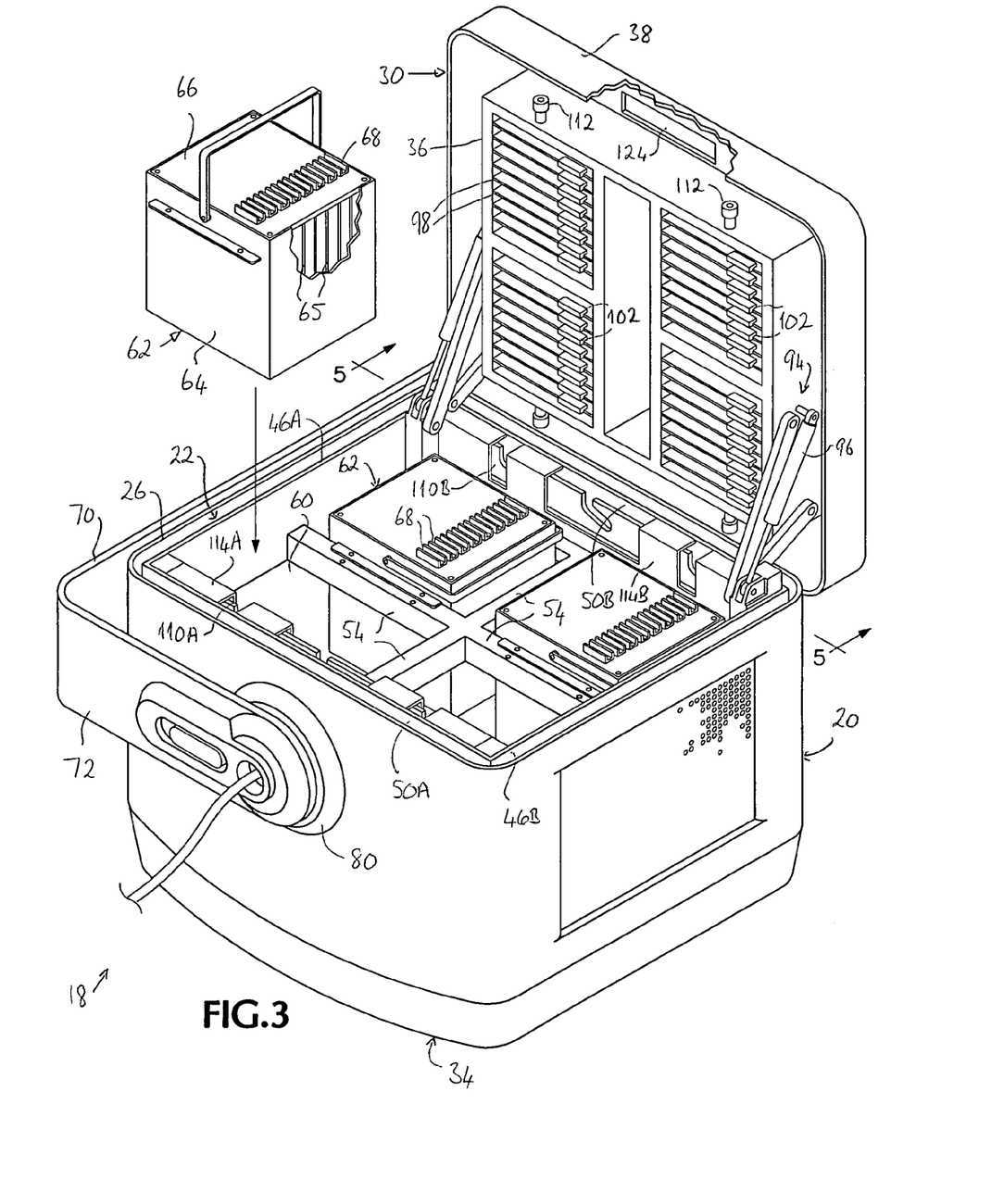
FIG. 3 is a similar view of the test head in an open configuration.
Figure 6:
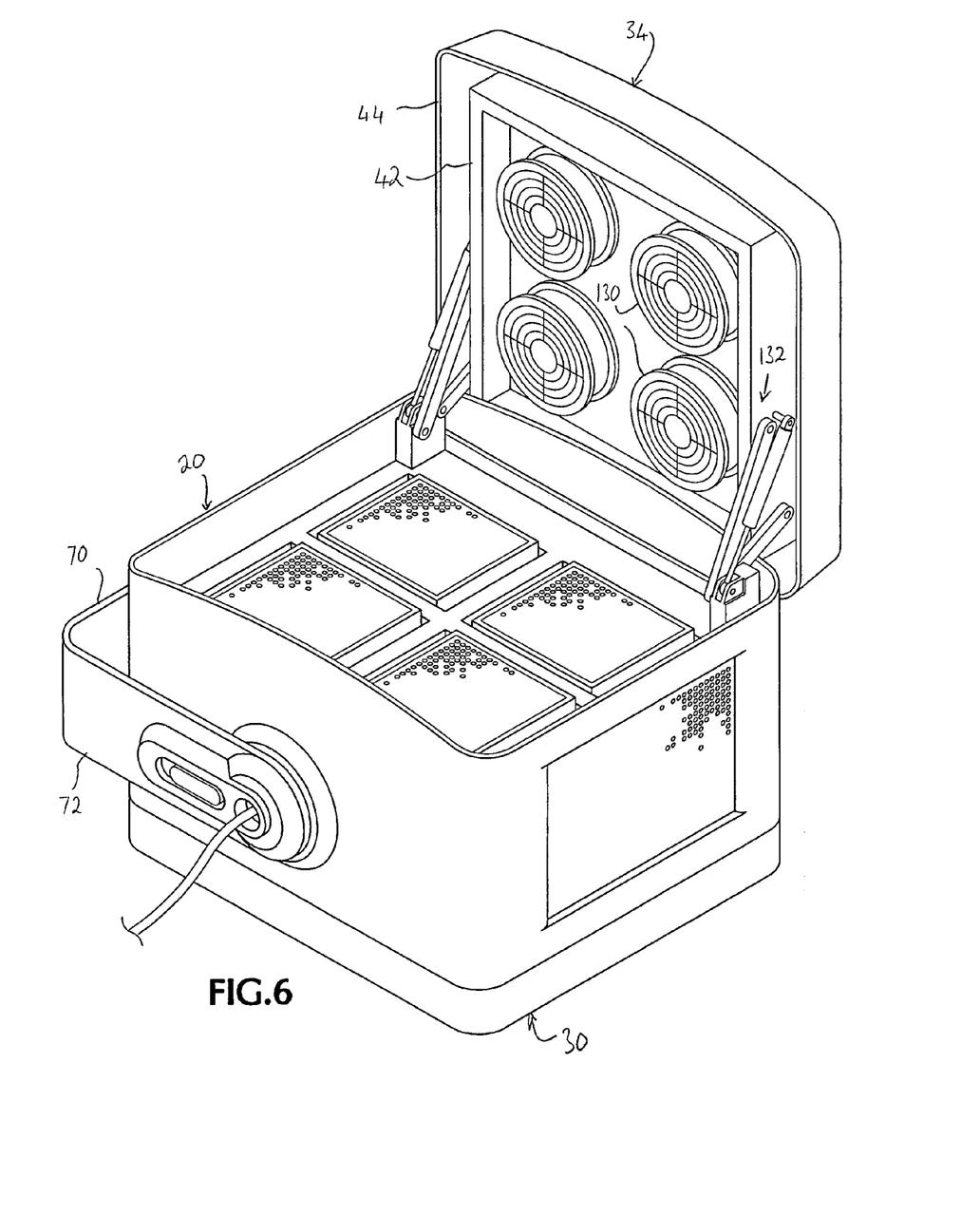
FIG. 6 is a view similar to FIG. 2 showing the test head in inverted orientation.

Referring to FIGS. 2, 3 and 6, the test head 18 is generally parallelepipedal in external configuration and includes a generally rectangular main body 20, an upper door 30 attached to the main body at the top, and a lower door 34 attached to the main body at the bottom. The main body 20 includes a main chassis 22 mounted in a protective casing 26 made of sheet metal. Similarly, the upper door 30 includes an upper door chassis 36 and a sheet metal casing 38 and the lower door 34 includes a lower door chassis 42 (FIG. 6) and a sheet metal casing 44.

Words of orientation, such as "upper" and "lower" used in connection with the upper door or a component thereof relate to the orientation of the door (or component) when the test head is in the orientation shown in FIG. 2 and the upper door is closed.

The main chassis 22 has a front wall 46A, a back wall 46B, and two opposite side walls 50A, 50B, collectively defining a rectangular chamber, and interior walls 54 that divide the chamber into four equal rectangular compartments 60. Each compartment is shaped to receive a standard-sized tester module 62. Since the compartments are equal, any given module can be placed in any one of the compartments. Each tester module comprises a tester module chassis 64 and pin electronics cards 65 mounted in the chassis and each having an upper edge at which it is provided with a connector. The tester module also includes a tester module interface structure 66 having a lower side at which it is provided with connectors engaging the connectors of the pin electronics cards and an upper side provided with connectors

68. The pins of the connectors of the pin electronics cards 65 are connected to corresponding pins of the connectors 68.

The manipulator includes a U-shaped frame having a base 70 and two arms 72. In the orientation shown in FIGS. 1-3, the base and arms of the frame are horizontal.

Figure 4:
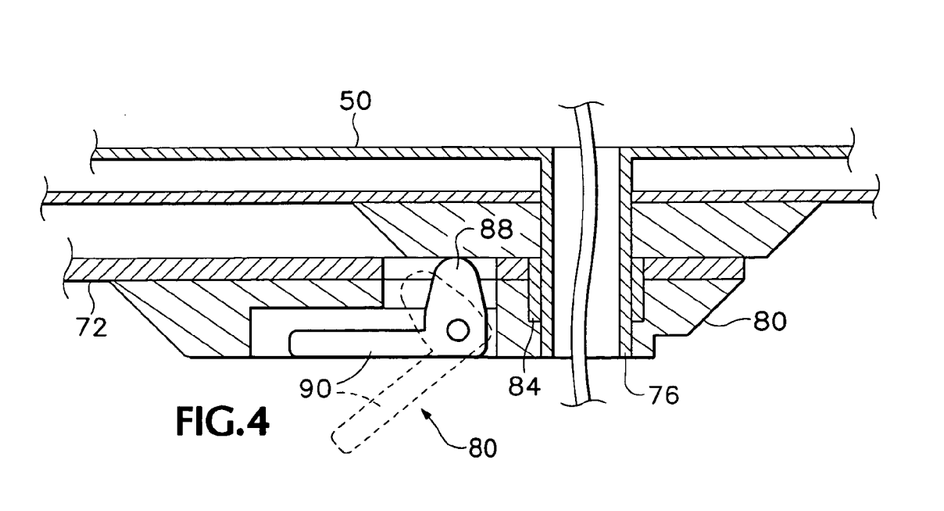
FIG. 4 is an enlarged sectional view of part of the test head shown in FIG. 2.

Referring to FIG. 4, a tubular shaft 76 projects from each side wall 50 of the main chassis through a bushing 80 attached to the wall of the casing 26. The shafts 76 are coaxial and are journalled in bearings 84 mounted in the ends of the manipulator arms 72 respectively. Each manipulator arm incorporates a pivotal cam lock 86 having a shoe 88 and an operating arm 90. When the cam lock is closed, as shown in solid lines in FIG. 4, the shoe bears against the bushing 80, whereas when the cam lock is open (dashed lines), the shoe is clear of the bushing.

Referring again to FIG. 3, the upper door chassis 36 is pivotally connected to the test head main chassis 22 by a hinge 94 that permits movement of the upper door relative to the main body 20 between a closed position (FIG. 2) and an open position (FIG. 3). Two air springs 96 are connected between the main chassis and the door chassis for supporting the weight of the upper door when it is moved between the open and closed positions.

The upper door chassis has two side walls, a front wall and a rear wall. These walls, and interior walls of the upper door chassis, define four compartments, corresponding respectively to the four compartments 60 defined in the main chassis 22. Each of the four compartments of the upper door chassis contains multiple circuit boards 98 each having a lower edge and an upper edge. Each circuit board 98 is provided with a connector 102 at its lower edge and a connector 106 (FIG. 2) at its upper edge, and the conductive traces of the circuit board connect the pins of the connector 102 to corresponding pins of the connector 106. The four groups of circuit boards 98 and the connectors 102 and 106 collectively form a test head interface structure. When the upper door is in its closed position, each connector 68 of each tester module interface structure 66 is engaged with a corresponding connector 102 of the test head interface structure.

Let us define a contact plane of the main body of the tester as the plane that contains the upper edges of the walls 46A, 48B, 50A, 50B of the main chassis 22 and let us define a contact plane of the upper door as the plane of the upper door chassis that coincides with the contact plane of the main body when the upper door is fully closed. In the event that it is desired to displace an element of the upper door chassis 36 by a distance d relative to the main chassis 22 by effecting pivotal movement of the chassis 36 relative to the chassis 22 about a fixed axis at a distance r from the element of the chassis 36, the chassis 36 must turn through an angle d/r radians. When the chassis 36 turns about a fixed axis through an angle d/r radians relative to the chassis 22, every element of the chassis 36 changes its orientation relative to the chassis 22 by the angle d/r radians. Consequently, if the upper door chassis were connected to the main chassis by a simple hinge defining a pivot axis that was fixed relative to the upper door chassis, a connector 102 at a distance of 10 cm from the pivot axis would turn through 1/10 radians, or about 6°, during engagement with a corresponding connector 68 if it were necessary to effect displacement of the connectors through 1 cm from just touching to fully engaged. Turning the connectors 102 through an angle as large as 6° relative to the connectors 68 during engagement may damage the connectors.

The hinge 94 that connects the upper door to the main chassis is not a simple hinge that allows pivotal relative movement of the two chassis 22 and 36 about an axis that is fixed relative to the two chassis, but a four bar hinge that allows pivotal movement of the upper door relative to the main chassis but constrains the path of movement of the upper door relative to the main chassis so that the instantaneous location of the pivot axis about which the door turns is a function of the angle of the upper door chassis relative to the main chassis. Consequently, the orientation of the upper door chassis relative to the main chassis does not vary in the same way as if a simple hinge were employed. Specifically, during the last phase of closing movement of the upper door, the axis of pivotal movement is much farther away from the main chassis than when the upper door is in the fully open position, as shown in FIG. 3. Consequently, as the upper door approaches the last phase of closing movement the contact plane of the upper door is oriented substantially parallel to the contact plane of the main body, and during the last phase of closing movement the contact plane of the upper door remains substantially parallel to the contact plane of the main body and the upper door moves substantially linearly towards the main body.

Each of the connectors 68 may have 100 or more pins. Therefore, a substantial force is required to engage or disengage the connectors 68 and 102.

The main body 20 also accommodates a cam mechanism for assisting in closing and opening the upper door and for securing the upper door in the closed position. The cam mechanism includes two cam bars 110A, 110B extending adjacent the side walls 50A, 50B respectively of the main chassis. The cam bars 110A, 110B are partially enclosed by cam bar housings 114A, 114B. Each cam bar 110 is attached to the corresponding wall 50 of the main chassis by fasteners (not shown) that hold the cam bar 110 parallel to the wall 50 and at a fixed distance from the wall and allow movement of the cam bar relative to the wall in directions parallel to the upper edge of the wall but prevent movement of the cam bar relative to the wall in directions perpendicular to the upper edge of the wall. An air motor (not shown) is attached to the wall 50 and is coupled to the cam bar 110 for driving the cam bar linearly relative to the adjacent wall 50 between a right limit position and a left limit position, through an intermediate rest position. Limit switches (not shown) detect when the cam bar is in a limit position or the intermediate rest position.

Cam followers 112 project from the lower edges of the front and rear walls of the upper door chassis.

Figure 5:
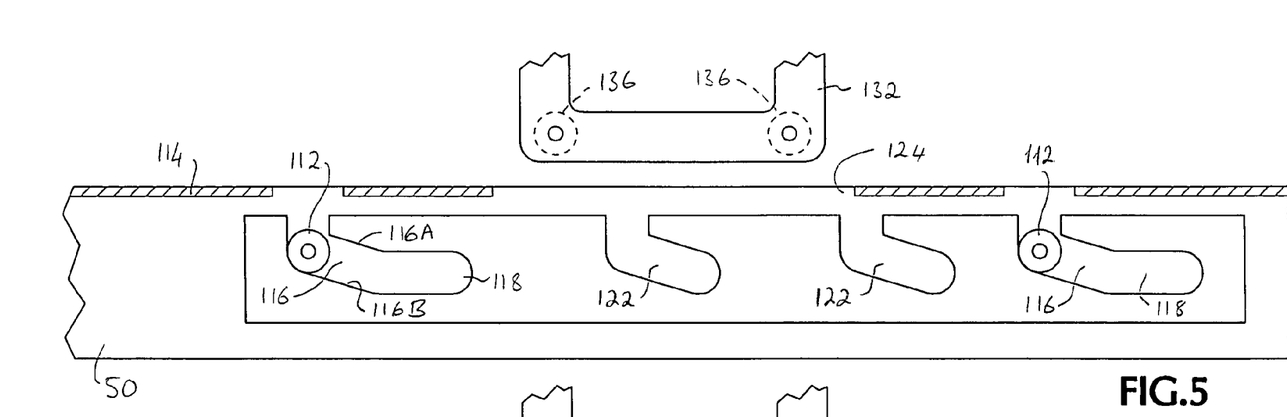
FIG. 5 is an enlarged sectional view taken on the line 5-5 in FIG. 3 and illustrates a cam mechanism that is part of the test head shown in FIGS. 2 and 3, FIGS. 5A and 5B illustrate operation of the cam mechanism.

Referring to FIG. 5, each cam bar 110 is formed with two cam slots 116 each having an entrance region and a working region bounded between upper and lower surfaces 116A and 116B. The cam slots 116 each have a dwell 118 at the lower end of the working region of the slot. The cam bar is also formed with two additional slots 122 between the two slots 116. The length of the slots 122 parallel to the direction of movement of the cam bar 110 is no greater than the length of the dwell 118 of the slots 116. The purpose of the dwells 118 and the additional cam slots 122 will be described later.

Figure 5A:
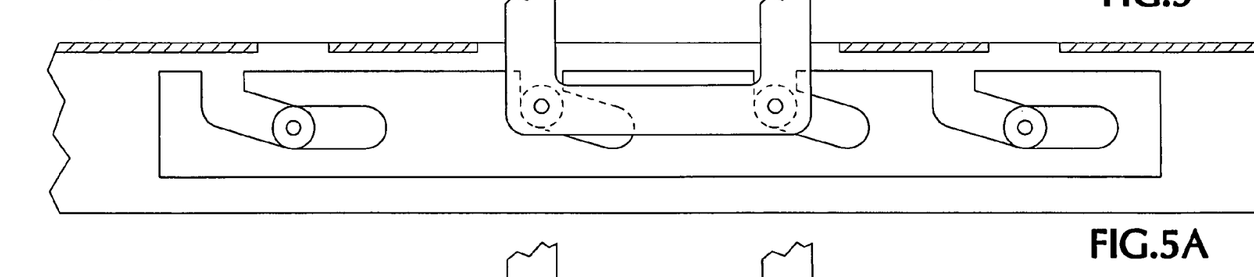

Let us assume that each cam bar is at the right limit position (FIG. 5) and the upper door is in the fully open position, as shown in FIG. 3. In this position, the operator may remove a tester module 62 from its compartment and replace it with a different tester module. The operator may also remove a circuit board 98 from the test head interface structure if necessary, for example in order to replace a defective board with an operative board. The operator may then lower the upper door until the cam followers 112 are located in the entrance regions of the respective cam slots 116, as shown in FIG. 5. The air springs help support the weight of the upper door during the closing movement. The constraint imposed by the four bar hinge 94 ensures that all four cam followers 112 enter the respective cam slots 116 substantially simultaneously. In this position, the connectors 102 of the test head interface structure are aligned with the corresponding connectors 68 of the tester module interface structures but are not firmly engaged. From this position, the connectors 102 must travel through a distance of about  cm in order to become fully engaged with the connectors 68. The operator actuates the air motors, which drive the cam bars 110 to the left. As the cam bars move to the left, the upper surface 116A of the working region of each cam slot 116 engages the follower 112 in the cam slot, and since the surface 116A is inclined downward and the cam bar is restrained against movement perpendicular to the edge of the wall 50, the cam bar forces the follower downwards until the follower reaches the end of the working region of the cam slot (FIG. 5A). In this manner, the upper door is forced to its fully closed position, in which the connectors 102 of the test head interface structure are fully engaged with the connectors 68** of the test module interface structures.

The change in orientation of the upper door relative to the main body when the closure mechanism pulls the upper door from the engagement position to the fully closed position is not so great as to damage the connectors 102 or 68.

When the followers 112 enter the cam slots 116, rollers (not shown) attached to the upper door chassis at the front and rear edges enter respective slots that are perpendicular to the direction of travel of the cam bars and are defined by guides (not shown) attached to the cam bar housings 114. Interaction of the rollers and guides restrains the upper door against movement relative to the main body 20 parallel to the direction of travel of the cam bars while the door is being forced to the fully closed position.

Figure 5B:
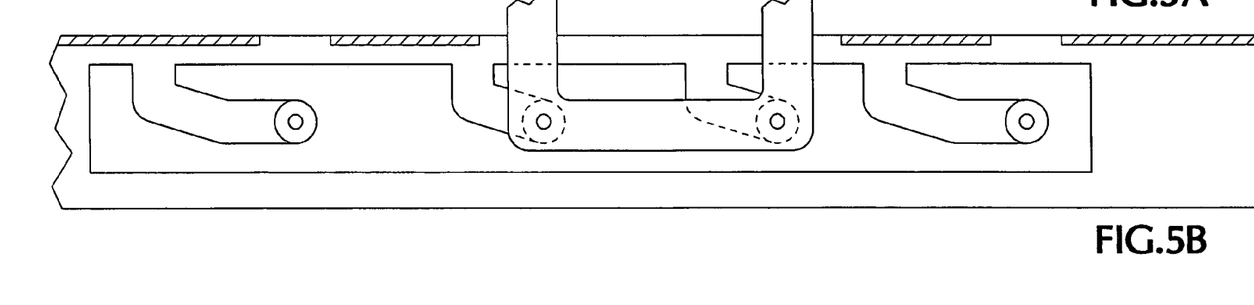

When the upper door 30 has been closed fully, a load board assembly may be secured to the test head interface structure. Referring to FIG. 2, the load board assembly includes a load board 128 and a stiffener frame 130 having traction bars 132 projecting therefrom. Each traction bar is provided with two cam followers 136. The upper door 30 is formed with two slot-form apertures 124, adjacent opposite respective sides of the upper door, for receiving the traction bars 132. When the upper door is in the closed position, the cam bars 110 are positioned so that the entrances to the cam slots 122 are accessible through the apertures 124 in the upper door. The load board assembly can be positioned over the upper door and the traction bars 132 of the stiffener frame 130 fitted in the apertures 124 so that the cam followers 136 enter the entrance regions of the slots 122 respectively. The operator is then able to actuate the air motors again and the motors drive the cam bars through the second part of their travel to the left, to the position shown in FIG. 5B. Since the cam followers 112 are located in the dwells 118 of the respective slots 116, the movement of the cam bars has no effect on the upper door, but interaction of the cam bars 110 and the cam followers 136 forces the load board assembly downwards, forcing the connectors on the lower side of the load board 128 into engagement with the connectors 106 of the test head interface structure.

Each of the tester modules has a power supply receptacle for receiving a plug connected to one end of a power supply cable. The opposite end of the power supply cable is connected to a power supply that is external of the test head. The power supply cable enters the test head through one of the tubular shafts. Similarly, compressed air lines for supplying compressed air to the motors are threaded through one or both of the tubular shafts 76.

Each of the tester modules also has at least one RJ45 jack for receiving an RJ45 plug attached to one end of a high speed network cable. The network cable passes from the test head through one of the tubular shafts 76 and is connected to the host computer for passing test data and commands between the host computer and the tester modules. Because the network cables and the utility lines (power supply cables and compressed air lines) pass through the tubular shafts, the probability of damage being caused by interference between the network cables or utility lines and the frame is small.

The location of the tubular shafts 76 is chosen to be relatively close to the center of gravity of the test head when the upper and lower doors are closed. Therefore, the force required to be exerted by the cam locks 86 in order to prevent turning movement of the test head is relatively small and in the event that the cam locks are released, the test head will not rapidly turn towards its position of stable equilibrium. The weight of the test head and the distance of the center of gravity of the test head from the common axis of the tubular shafts when the common axis is horizontal and the test head is oriented so that the center of gravity is at the same vertical height as the common axis of the shafts are such that if the cam locks are released a torque of about 20 ft lbs is sufficient to sufficient to restrain the test head against turning due to the force of gravity and, correspondingly, a torque of about 20 ft lbs is sufficient to turn the test head about the common axis of the shafts against the force of gravity. In the event that the cam locks are engaged, a torque of about 75 ft lbs is required to turn the test head.

Referring to FIG. 6, in which the main body of the test head is shown inverted with respect to FIGS. 2 and 3 and accordingly the lower door 34 is above the main body 20, several cooling fans 130 are mounted in the lower door chassis 42 for inducing a flow of air in the test head for cooling the test head. The lower door chassis is connected to the main test head chassis by a four bar hinge 132 similar to that used for attaching the upper door chassis. This helps to reduce part count and the four bar hinge is in any event advantageous because it helps ensure that the protective casing 44 of the lower door mates properly with the protective casing 26 of the main body when the lower door is closed.

Figure 7:
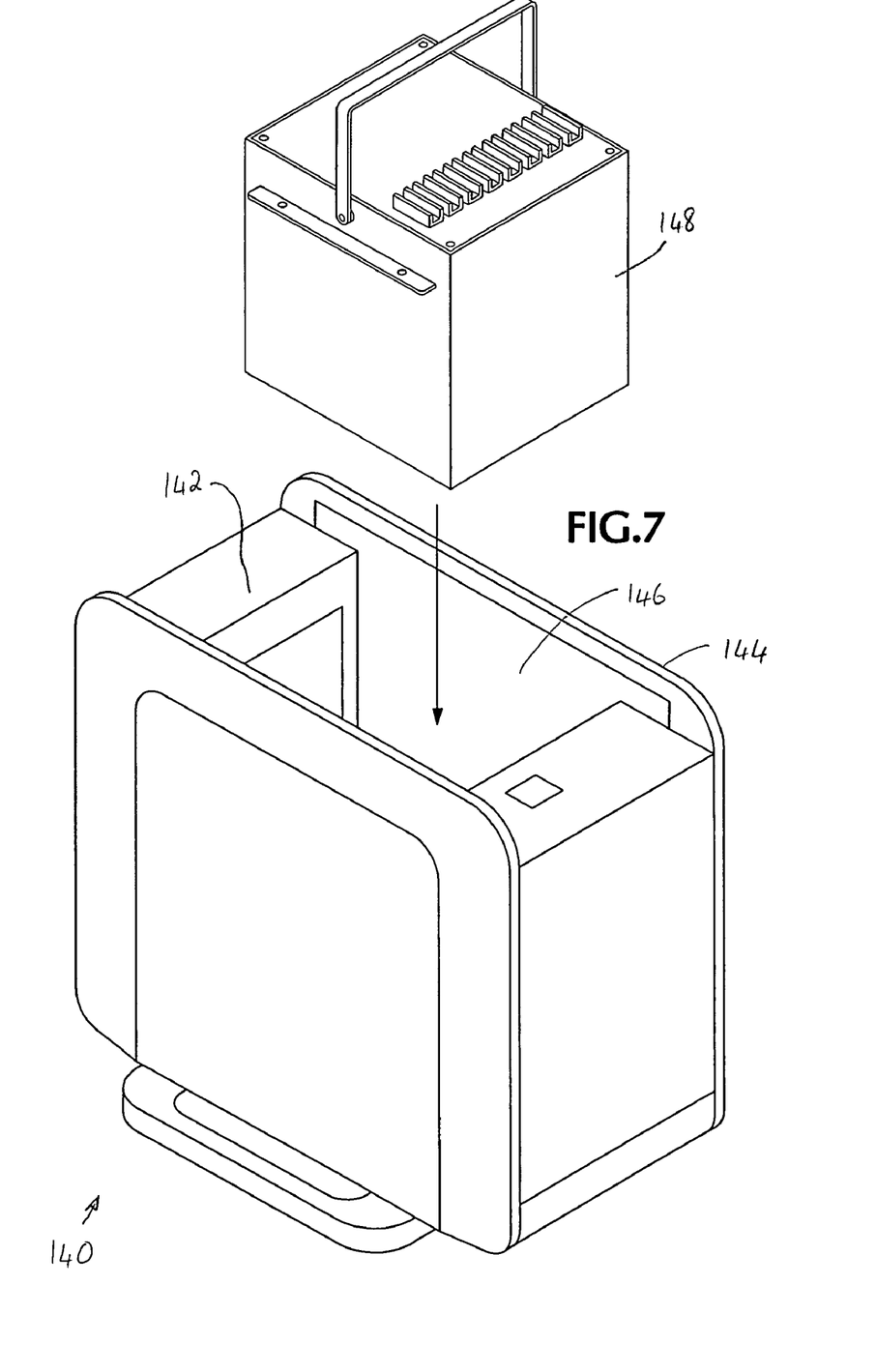
FIG. 7 is a perspective view of a personal tester.

The production tester described with reference to FIGS. 1-6 is designed to be used in a facility that may also include one or more personal testers as shown in FIG. 7. The personal tester 140 shown in FIG. 7 includes a chassis 142 and an outer protective casing 144. The chassis 142 defines a compartment 146 in which a tester module 148 similar to the tester modules of the production tester is installed. The chassis includes a power supply for supplying operating power to the tester module via a power supply cable and the power supply socket. The network cables that are plugged into the RJ45 jacks of the tester module are connected at their opposite ends to a personal workstation. The tester module may be designed to enable the personal tester to carry out digital testing or mixed signal testing, for example. The tester module 148 is removable from the chassis and may be installed in one of the compartments 60 of the test head 18 of the production tester. Accordingly, when a tester module is not required for use in the production tester, its resources are available for use in the personal tester and need not be idle.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A test head for an integrated circuit tester, the test head comprising:
   a main chassis defining a chamber having a top and a bottom, the chamber being open at the top,
   at least first and second tester modules installed in the chamber, each tester module comprising a tester module chassis, a plurality of pin electronics cards, and a tester module interface structure,
   a test head interface chassis,
   a support structure attached to the test head interface chassis and the main chassis and supporting the test head interface chassis for movement relative to the main chassis between first and second positions, and
   a test head interface structure mounted in the test head interface chassis and engageable with the tester module interface structures of the tester modules for connecting the tester module interface structures to a device interface unit,
   and wherein the tester module interface structure comprises a plurality of connectors,
   the test head interface structure comprises a plurality of circuit boards each having first and second opposite edges and a first connector attached to the circuit board at the first edge thereof,
   in the first position of the test head interface chassis the first connectors of the circuit boards of the interface structure engage respective connectors of the tester module interface structures,
   and in the second position of the test head interface chassis the test head interface chassis is spaced from the main chassis, the tester module interface structures are exposed at the top of the chamber, and each tester module is removable as a unit from the chamber.

2. A test head according to claim 1, wherein the test head interface structure comprises first and second interface units engageable with the tester module interface structures of the first and second tester modules respectively.

3. A test head according to claim 2, wherein the tester module interface structure of each tester module comprises a plurality of connectors, each unit of the test head interface structure comprises a plurality of circuit boards each having first and second opposite edges and a first connector attached to the circuit board at the first edge thereof, and the first connectors of the circuit boards of the first and second interface units are engageable with the connectors of the tester module interface structures of the first and second tester modules respectively.

4. A test head according to claim 3, wherein each circuit board of the test head interface structure has a second connector at its opposite edge for engagement with a device interface unit.

5. A test head for an integrated circuit tester, the test head comprising:
   a main chassis defining a chamber having a top and a bottom, the chamber being open at the top,
   at least first and second tester modules installed in the chamber, each tester module being removable as a unit from the chamber and comprising a tester module chassis, a plurality of pin electronics cards, and a tester module interface structure exposed at the top of the chamber,
   a test head interface structure engageable with the tester module interface structures of the tester modules for connecting the tester module interface structures to a device interface unit,
   a test head interface chassis, and
   a hinge structure that attaches the test head interface chassis to the main chassis in a manner permitting angular movement of the test head interface chassis relative to the main chassis,
   and wherein the test head interface structure is mounted in the test head interface chassis, whereby angular movement of the test head interface chassis relative to the main chassis effects engagement of the test head interface structure with the tester module interface structures.

6. A test head according to claim 5, wherein the test head interface chassis and the main chassis each have a contact plane, the respective contact planes are coplanar when the test head interface structure is fully engaged with the tester module interface structures and otherwise the contact planes are mutually inclined and intersect in a line, and the hinge structure is a four bar hinge structure such that the instantaneous location of the line in which the contact planes intersect is a function of angle at which the contact planes are mutually inclined.

7. A test head according to claim 1, wherein the first and second tester modules are functionally different.

8. A test head for an integrated circuit tester, the test head comprising:
   a main chassis,
   a pin electronics interface structure mounted in the main chassis and defining an engagement axis,
   a test head interface structure engageable with the pin electronics interface structure and disengageable from the pin electronics interface structure by movement relative to the pin electronics interface structure substantially along the engagement axis,
   an engagement mechanism for forcing the test head interface structure into engagement with the pin electronics interface structure, the engagement mechanism comprising a cam follower that projects from the test head interface structure, a cam member that is attached to the main chassis and is movable relative to the main chassis, the cam member being formed with a first cam slot including an entrance region for receiving the cam follower that projects from the test head interface structure, and a drive mechanism effective to drive the cam member to move relative to the main chassis, and
   a device interface unit engageable with the test head interface structure and disengageable from the test head interface structure by movement relative to the test head interface structure substantially along said engagement axis,
   and wherein the engagement mechanism further comprises a cam follower that projects from the device interface unit, and the cam member is formed with a second cam slot including an entrance region for receiving the cam follower that projects from the device interface unit, whereby movement of the cam member in a first direction both forces the test head interface structure into engagement with the pin electronics interface structure and forces the device interface unit into engagement with the test head interface structure.

9. A test head according to claim 8, wherein the first cam slot has a dwell region and also has an inclined region that extends between the entrance region and the dwell region, the second cam slot has an inclined region that extends from the entrance region, whereby the test head interface structure and the device interface unit are sequentially engaged with the pin electronics interface structure and the test head interface structure respectively, by moving the cam member in the first direction in a first stage with the cam follower that projects from the test head interface structure in the inclined region of the first cam slot and in a second stage with the cam follower that projects from the test head interface structure in the dwell region of the first cam slot and the cam follower that projects from the device interface unit in the inclined region of the second cam slot.

10. A test head according to claim 9, wherein the main chassis has first and second opposite edges, the test head interface structure has first and second opposite edges, and the engagement mechanism comprises first and second cam followers that project from the test head interface structure at the first and second edges respectively, first and second cam members that are attached to the main chassis adjacent the first and second edges respectively and are each formed with a first cam slot for receiving, respectively, the first and second cam followers that project from the test head interface structure, first and second drive mechanisms effective to drive the first and second cam members respectively to move relative to the main chassis, first and second cam followers that project from the device interface unit at the first and second edges respectively, and the first and second cam members are each formed with a second cam slot for receiving, respectively, the first and second cam followers that project from the device interface structure.

11. A test head according to claim 8, wherein the main chassis has first and second opposite edges, the test head interface structure has first and second opposite edges, and the engagement mechanism comprises first and second cam followers that project from the test head interface structure at the first and second edges respectively, first and second cam members that are attached to the main chassis adjacent the first and second edges respectively and are each formed with a first cam slot for receiving, respectively, the first and second cam followers that project from the test head interface structure, and first and second drive mechanisms effective to drive the first and second cam members respectively to move relative to the main chassis.

12. A test head for a semiconductor integrated circuit tester, the test head comprising:
   a main chassis having first and second opposite main faces,
   a tester module interface structure exposed at the first main face of the main chassis,
   a test head interface structure attached to the main chassis and engaging the tester module interface structure at the first main face of the main chassis, and
   a door structure attached to the main chassis and pivotable relative to the main chassis between a first position, in which the door structure engages the main chassis at the second main face, and a second position, in which the door structure permits access to the main chassis by way of the second main face.

13. A test head according to claim 12, wherein the door structure includes at least one fan for inducing a flow of cooling air through the main chassis.

14. A test head according to claim 5, wherein the tester module interface structure of each tester module comprises a plurality of connectors, and the test head interface structure comprises a plurality of connectors engageable whit respective connectors of the tester module interface structures.

15. A test head according to claim 5, wherein the test head interface structure comprises first and second interface units engageable with the tester module interface structures of the first and second tester modules respectively.

16. A test head according to claim 15, wherein the tester module interface structure of each tester module comprises a plurality of connectors, each unit of the test head interface structure comprises a plurality of circuit boards each having first and second opposite edges and a first connector attached to the circuit board at the first edge thereof, and the first connectors of the circuit boards of the first and second interface units are engageable with the connectors of the tester module interface structures of the first and second tester modules respectively.

17. A test head according to claim 16, wherein each circuit board of the test head interface structure has a second connector at its opposite edge for engagement with a device interface unit.

* * * * *